(12) United States Patent
Blattner et al.

(10) Patent No.: US 6,431,811 B1
(45) Date of Patent: Aug. 13, 2002

(54) TRANSFER DEVICE FOR SEMICONDUCTOR WAFERS

(75) Inventors: Jakob Blattner, Ermatingen; Hans Schmid, Langnau am Albis; Bernhard Strasser; Christian Balg, both of Tägerwilen, all of (CH)

(73) Assignee: Brooks Automation AG, Tägerwilen (CH)

( * ) Notice: Subject to any disclaimer, the term of this patent is extended or adjusted under 35 U.S.C. 154(b) by 0 days.

(21) Appl. No.: 09/508,335

(22) PCT Filed: Sep. 8, 1998

(86) PCT No.: PCT/CH98/00385

§ 371 (c)(1),
(2), (4) Date: May 10, 2000

(87) PCT Pub. No.: WO98/13497

PCT Pub. Date: Mar. 18, 1999

(30) Foreign Application Priority Data

Sep. 10, 1997 (EP) .............................. 97115686
Oct. 16, 1997 (CH) ................................ 2419/97

(51) Int. Cl.[7] .............................................. B65G 49/07
(52) U.S. Cl. ...................... 414/404; 414/757; 414/811; 414/936
(58) Field of Search ..................... 414/404, 416.02, 414/416.09, 433, 757, 777, 811, 936, 938

(56) References Cited

U.S. PATENT DOCUMENTS

| | | | | |
|---|---|---|---|---|
| 4,566,839 A | * | 1/1986 | Butler | 414/404 |
| 4,573,851 A | * | 3/1986 | Butler | 414/404 |
| 4,611,966 A | | 9/1986 | Johnson | |
| 4,695,217 A | | 9/1987 | Lau | |
| 4,856,957 A | * | 8/1989 | Lau et al. | 414/404 |
| 4,952,115 A | * | 8/1990 | Ohkase | 414/404 |
| RE33,341 E | * | 9/1990 | Lee et al. | 414/404 |
| 5,183,378 A | * | 2/1993 | Asano et al. | 414/757 |
| 5,207,548 A | * | 5/1993 | Suffel | 414/404 |
| 5,620,295 A | * | 4/1997 | Nishi | 414/404 |

FOREIGN PATENT DOCUMENTS

| | | |
|---|---|---|
| EP | 0 163 413 | 12/1985 |
| EP | 0 496 006 | 7/1992 |
| JP | 60045031 | 3/1985 |

* cited by examiner

*Primary Examiner*—James W. Keenan
(74) *Attorney, Agent, or Firm*—Venable; Gabor J. Kelemen; Chad C. Anderson

(57) ABSTRACT

In order to achieve a higher compaction ratio with a wafer transfer apparatus for transferring wafers stacked in an interspaced manner in a first holding device, e.g. a magazine, to a second holding device, which has a carrier device which is provided with two rollers which are arranged parallel to one another and can each be rotated about its longitudinal axis, the rollers can be arranged in a plurality of rotational positions, each roller is provided with a plurality of wafer receptacles extending over at least part of their circumference, some of the receptacles are arranged offset both in the longitudinal direction and in the circumferential direction of the roller and are arranged in segment portions of the circumference of the roller which extend essentially parallel to the longitudinal axis of the respective roller, the proposal according to the invention is that in at least three segment portions (14, 15, 16, 17, 18, 19) there are receptacles (6) for wafers of in each case at least one wafer stack, at least a fourth segment portion (14–19) is formed, in which there are receptacles for the simultaneous arrangement of wafers of at least three wafer stacks, receptacles of different segment portions of the respective roller (2, 3) being offset both in the longitudinal direction of the roller (2, 3) and in the circumferential direction of the roller, and there being, in the at least fourth segment portion (14–19), receptacles which are essentially in alignment in the circumferential direction of the roller with receptacles (6) of the first three segment portions.

14 Claims, 6 Drawing Sheets

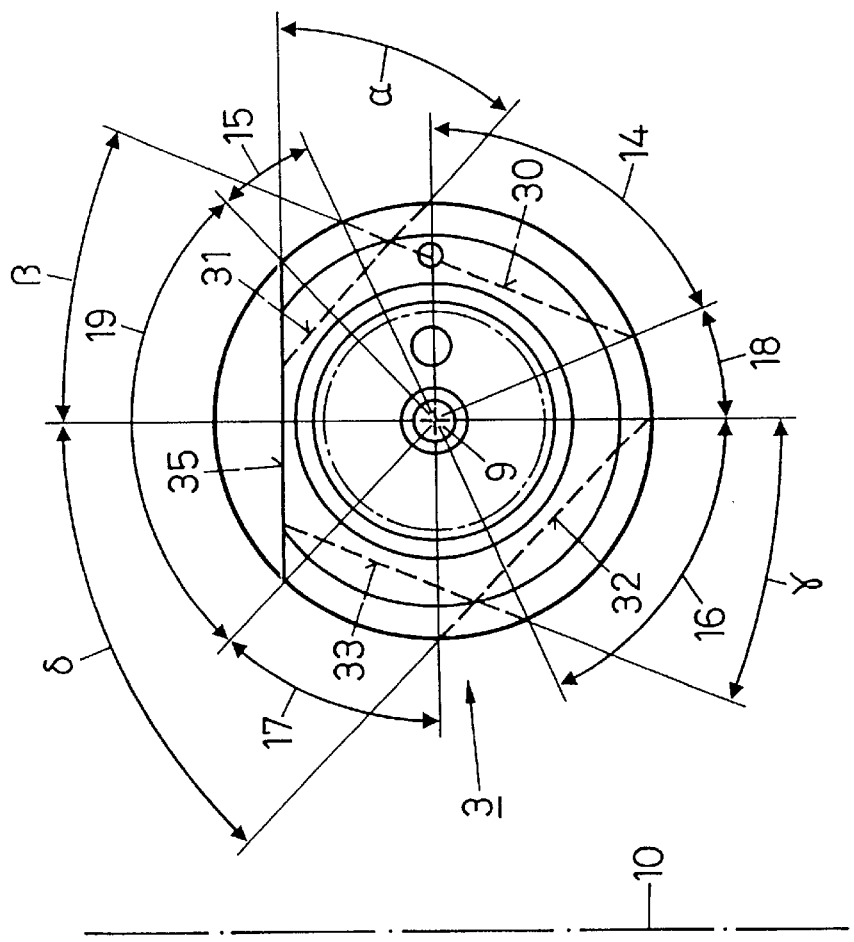
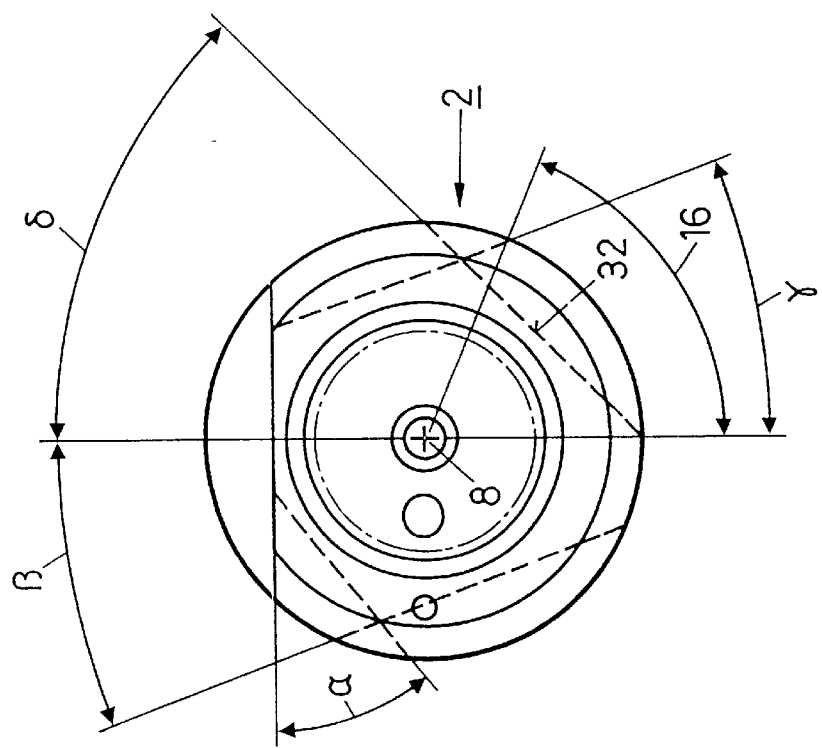
FIG. 3

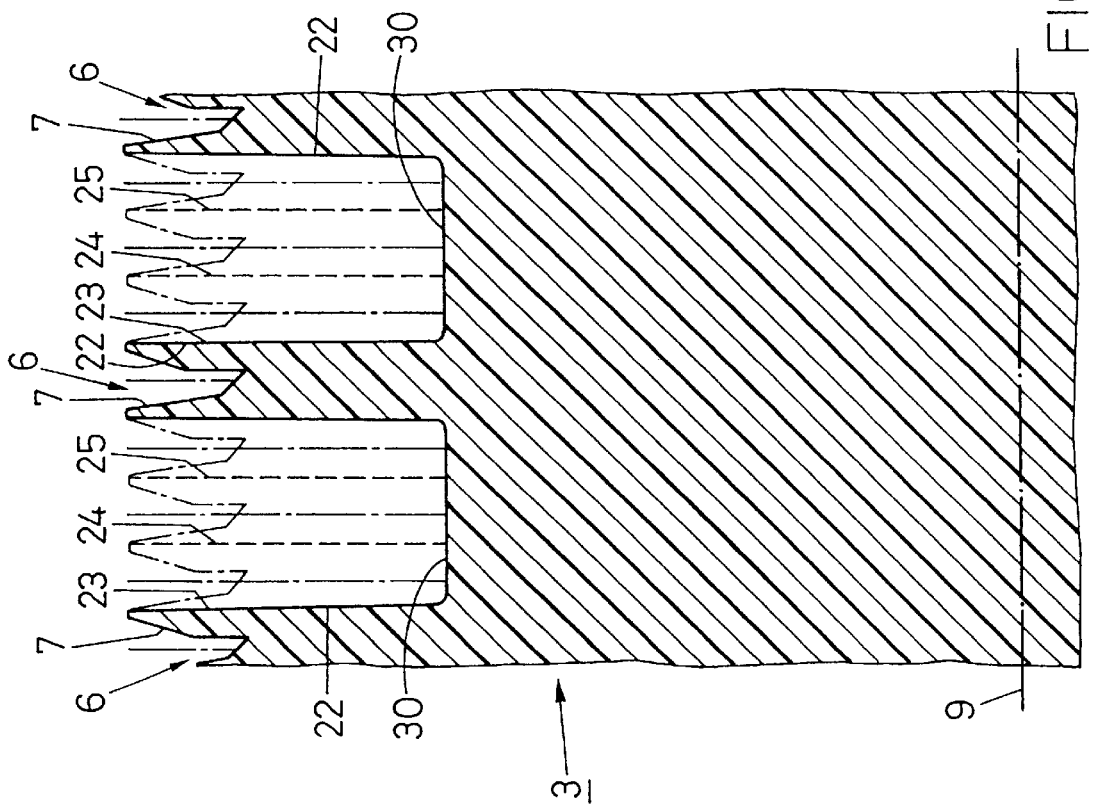
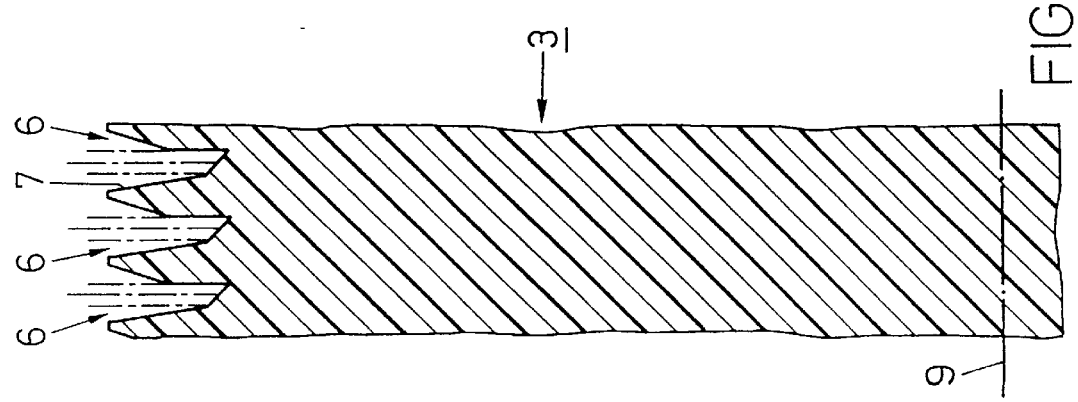

TRANSFER DEVICE FOR SEMICONDUCTOR WAFERS

BACKGROUND OF THE INVENTION

The invention relates to a wafer transfer apparatus for transferring and compacting wafers stacked in an interspaced manner in a first holding device, e.g. a magazine, into a second holding device, which has a carrier device which is provided with two rollers which are arranged parallel to one another and can each be rotated about its longitudinal axis, the rollers are operatively connected to drive means by means of which the rollers can be arranged in a plurality of rotational positions, each roller is provided with a plurality of wafer receptacles extending over at least part of their circumference. The receptacles are arranged offset both in the longitudinal direction and in the circumferential direction of the roller and are arranged in segment portions of the circumference of the roller which extend essentially parallel to the longitudinal axis of the respective roller. The invention furthermore relates to a method for transferring and compacting wafers.

A wafer transfer apparatus is known, for example, from EP 0 496 006. This gives a description of an apparatus in which wafers are transferred from one or more wafer holders to a carrier which has at least one loading station and one unloading station, lifting means for raising the wafers, support means moveable between the carriers, and actuating members connected to the said support means. The actuating members are in the form of cylindrical rollers which are mounted rotatably at one end in the support means and, perpendicular to their axis, have slots for guiding and receiving the wafers. In the wafer holder, e.g. magazines, the wafers are stored in a stacked, interspaced manner. The spacing between each here generally amounts to a multiple of the thickness of the wafers. The wafers can be arranged much closer together on the carrier if the wafers are to be fed for further processing, e.g. to an oven for heating purposes. To enable this processing to be carried out as efficiently as possible, it is advantageous to arrange the wafer stacks from the individual holders in a more compact form on the carriers. The solution proposed in the patent mentioned is suitable for this purpose.

However, the apparatus has the disadvantage that it can only be used to combine just two wafer stacks one inside the other in an offset arrangement. In other words: compared with the original arrangement of the wafers, they can only be transferred with a maximum compaction of 1:2.

BRIEF SUMMARY OF THE INVENTION

The object of the present invention is therefore to specify a measure by means of which at least two—but preferably more than two—wafer stacks can be stacked one inside the other by means of apparatuses or methods of the generic type in order to achieve compaction.

According to the invention, this object is achieved, in a transfer apparatus mentioned at the outset, by virtue of the fact that in at least three segment portions there are receptacles for wafers of in each case at least one wafer stack, at least a fourth segment portion is formed, in which there are receptacles for the simultaneous arrangement of wafers of at least three wafer stacks, receptacles of different segment portions of the respective roller being offset both in the longitudinal direction of the roller and in the circumferential direction of the roller, and there being, in the at least fourth segment portion, receptacles which are essentially in alignment in the circumferential direction of the roller with receptacles of the first three segment portions.

The invention is thus based on the idea of forming a basic sequence from a pattern by means of a number of receptacles corresponding at least to the compaction ratio, the said receptacles being offset both in the longitudinal and in the circumferential direction of the roller. This pattern is repeated several times, as seen in the longitudinal direction of the rollers. The number of repetitions preferably corresponds to the number of wafers present in one of the stacks to be compacted. As seen in the radial and in the circumferential direction of the rollers, receptacles for the wafers are thus arranged alternately in different segment portions. According to the invention, it is possible here to increase the compaction ratio of the wafer stack to be produced by increasing the number of segment portions on the circumference of the rollers. In particular, fourfold compaction can be achieved in this way.

The object is furthermore achieved by a method as described herein.

Preferred refinements of the invention will be found herein.

In the context of the invention, the word "compaction" is intended to mean the ratio of the spacings of the wafers in their original stack (as arranged in the transport container) to the spacings of the wafers in the newly produced wafer stack. The compaction is generally a ratio 1:x, where x is a whole number. However, the word "compaction" could also be understood to mean the number of initial stacks nested one within the other required to assemble a new wafer stack. With this definition too, a ratio 1:x, where x is a whole number, would be obtained, and x would be the number of initial stacks. It has proven advantageous if each roller has x+1, preferably x+2, segment portions. In order to be able to use the individual segment portions, the rollers should be able to assume a number of rotational positions corresponding to the number of segment portions.

BRIEF DESCRIPTION OF THE DRAWINGS

The invention will be explained in greater detail with reference to the illustrative embodiments depicted schematically in the figures, in which:

FIG. 3 shows a side view of the end faces of the rollers of the wafer transfer apparatus which are shown in FIG. 1, FIG. 4 shows a partial view of a longitudinal section through a first portion of a roller, FIG. 5 shows a partial view of a longitudinal section through a second portion of a roller.

DETAILED DESCRIPTION OF THE INVENTION

Figure 1:
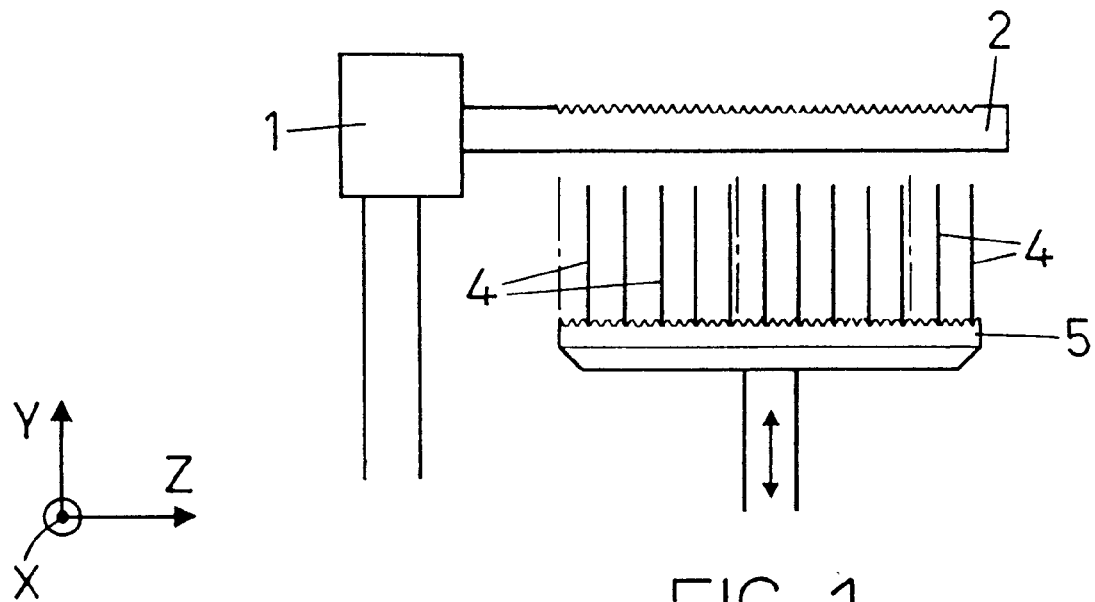
FIG. 1 shows a wafer transfer apparatus according to the invention shown in part in a side view.
Figure 2:
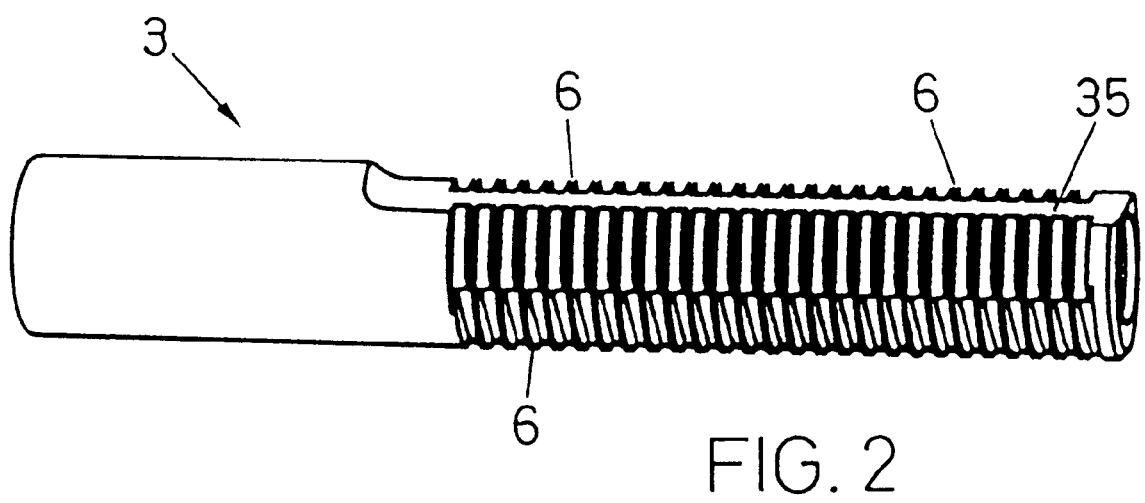
FIG. 2 shows a perspective representation of a roller of the wafer transfer apparatus shown in FIG. 1.

The apparatus shown in FIG. 1 has, as an intermediate storage location, a holding arrangement 1 with two rollers 2, 3, which are arranged parallel to one another and can each be rotated about their longitudinal axis. In FIG. 1, roller 3 is behind roller 2 and therefore cannot be seen in this illustration. The rollers 2, 3 are spaced apart in such a way that, in certain rotational positions of the rollers, wafers 4 are held in an essentially vertical orientation in slots made in the circumference of the rollers 2, 3. In other positions of the rollers 2, 3, the wafers can be moved between the rollers and the rollers can perform a vertical movement without the wafers accompanying this movement, as explained below. Shown below the rollers is a holding device, designed as a holding rack 5, in which wafers 4 are arranged vertically.

In order to transport the wafers 4 and perform the relative movements mentioned between the wafers 4 and the rollers 2, 3, the holding arrangement 1 is provided with drive means. The drive means, e.g. one or more electric motors, can be used to move the holding arrangement along a linear X axis and a Y axis of a Cartesian coordinate system. In the illustration in FIG. 1, the X axis corresponds to an axis extending orthogonally to the plane of the drawing, and the Y axis corresponds to a vertically aligned axis.

As shown in FIG. 1, the holding rack 5 arranged under the holding arrangement 1 can be of vertically adjustable design. For this purpose, the holding rack can be arranged on a lifting device, illustrated only in part, which is motor-driven and by means of which the holding rack can be moved vertically, i.e. in the Y direction, parallel to the longitudinal axes of the rollers 2, 3. As illustrated in highly schematized form in FIG. 1, the holding rack 5 has receptacles which are formed by a kind of toothing and in each of which a wafer 4 can be arranged. The spacing between adjacent receptacles corresponds to the compaction ratio to be achieved. In other words, the spacing between the $x^{th}$ receptacles corresponds to the spacing between two successive wafers in the initial stack, i.e. in the container from which they are taken.

According to the invention, the essentially cylindrical rollers 2, 3 have receptacles 6 which extend over at least part of their circumference and along a circumferential line and are designed as annular grooves 7, as can be seen from FIGS. 2 to 5. The term "circumferential line" is here taken to mean a line in a plane (an imaginary plane) aligned orthogonally to the longitudinal axis 8, 9 of the rollers 2, 3. The annular grooves are spaced apart and provided with a particular depth and shape, allowing wafers 4 to be held spaced apart in them in a vertical orientation without mutual contact. Both the length of the annular grooves 7 and the spacings between the annular grooves can be varied according to the degree of compaction which is intended. The shape of the annular grooves is furthermore configured in such a way that the respective wafer is supported only by its rear side and one lateral edge on boundary surfaces of the groove. The process or front side, which is to be protected particularly from soiling, does not come into contact with boundary surfaces of the groove.

The holding arrangement 1 and carrier device shown in the illustrative embodiment is designed for fourfold compaction, i.e. the wafers retrieved from their magazines by a gripping device (not shown) each come to rest on the holding rack in every fourth groove, as indicated in FIG. 1. The width and length of the holding rack 5 are here matched respectively to the width of the wafers and the number of wafers to be stacked.

In FIG. 3, which shows the ends of the rollers 2, 3, a chain-dotted line 10 indicates that the two rollers 2, 3 are of mirror-symmetrical design with respect to this line. This illustration, in particular, shows that the circumference of each roller can be divided into six segment portions 14, 15, 16, 17, 18, 19, segment portion 14 being used to accommo-date a first wafer stack, segment portion 15 to accommodate a second wafer stack, segment portion 16 to accommodate a third and segment portion 17 to accommodate a fourth wafer stack. As can furthermore be seen from the illustration, the angular ranges, indicated by arcs, over which the individual segment portions extend are of different sizes. Thus, of the six segment portions, four portions are assigned to respective wafers from one of the four initial stacks. The fifth portion 18 (portion "x+1"), on the other hand, is assigned to the new, compacted stack, and the sixth portion, denoted by 19, belongs to a neutral position, (in which the two rollers cannot grasp any wafers). A total of "x+2" segment portions are thus formed. α, β, γ and δ furthermore respectively represent the rotational angles which must be described to bring the four segment portions 14, 15, 16, 17 into the respective holding position.

Figure 6:
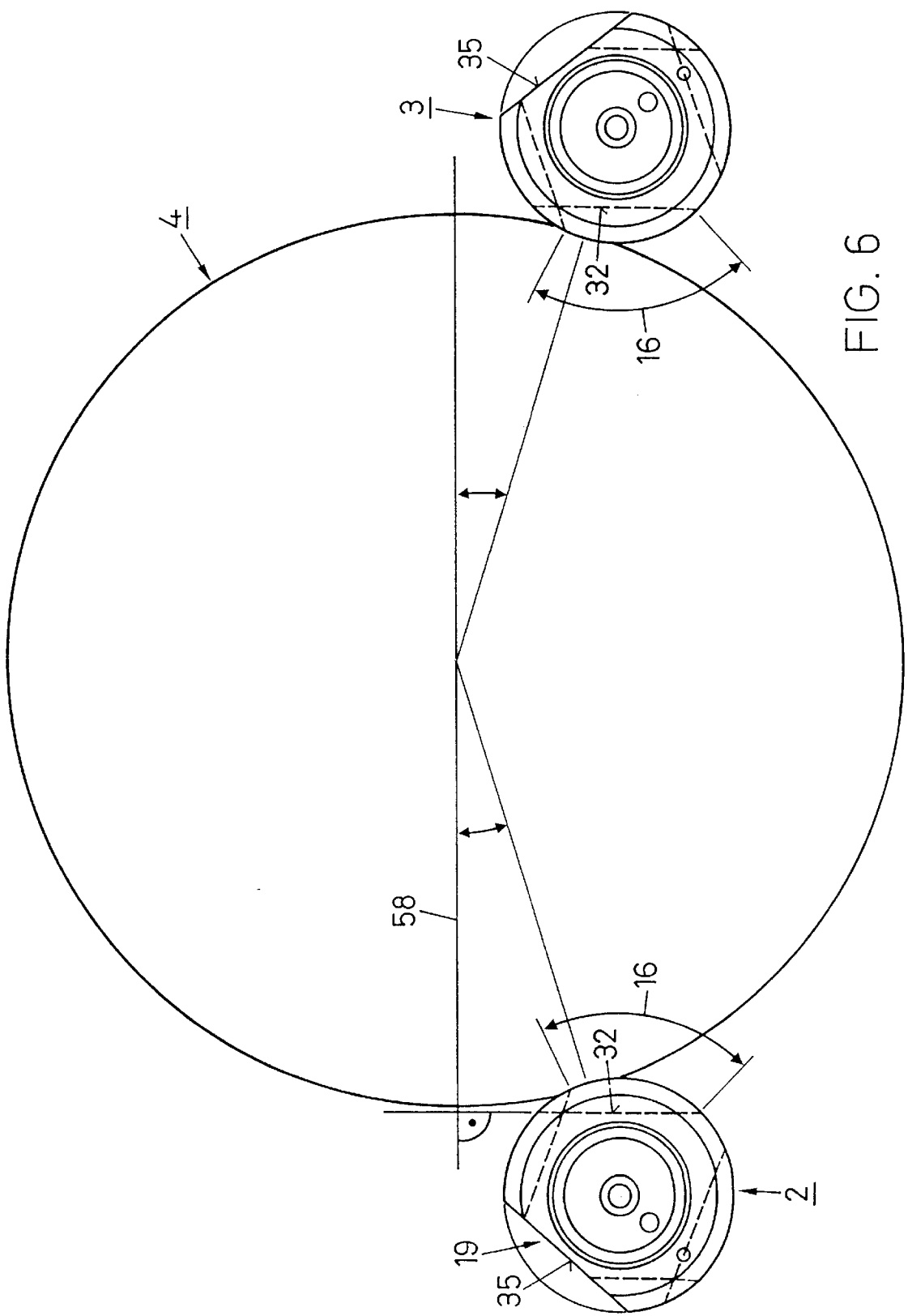
FIG. 6 shows a view in accordance with FIG. 3, in which a third wafer stack is held by in each case a third segment portion of the two rollers.

To illustrate this state of affairs, the two rollers are shown in FIG. 6 in a rotational position in which they hold wafers 4 of a third stack by means of the portions 16. The sequence and length, shown in this illustrative embodiment, of the six segment portions on the circumference of the rollers 2, 3 has proven particularly advantageous. However, the same functions as in the illustrative embodiment shown can also be made possible with other sequences and lengths of the portions.

The sectional representation in FIG. 4, in which the section plane passes through the longitudinal axis 9 and through segment portion 14, shows a plurality of annular portions 22, each of the same width, which extend from a flat bottom surface 30, which extends parallel to the longitudinal axis, and are used to hold the wafers of a first stack. These annular portions 22 extend over a certain angular range on the circumference of the roller. Apart from this annular portion, there is only an annular portion of the fifth segment portion 18 on the same circumferential line or in the same circumferential range, but this latter portion cannot be seen in this view. Otherwise, the maximum radial extent of the roller 3, as seen in the radial direction, is a bottom surface 30 extending between successive portions 22. In other words, there are no other annular portions between successive annular portions 22. A recess extending down to the bottom surface 30 is thus formed between the annular portions 22.

As with the annular portions 22, there are, between the annular portions 23, each of which is arranged offset in the circumferential direction, corresponding recesses with bottom surfaces 31. The same also applies to annular portions 24 and 25, between which there are respective bottom surfaces 32 and 33. In the illustration in FIG. 4, the annular portions 23, 24, 25 of the second, third and fourth segment portions, the said annular portions being represented in broken lines between the annular portions 22, are only shown for purposes of explanation. Both when viewed in the circumferential direction and in the direction of the longitudinal axis, they are offset relative to the annular portions 22 of the first wafer stack. The view would be essentially the same as that in FIG. 4 if the section were taken through the second, third or fourth portion 15, 16, 17 instead of through segment portion 14. In that case, it would then, of course, be necessary to show one of the other annular portions 23, 24, 25 instead of the annular portions 22.

As indicated in FIG. 5, the fifth segment portion 18, the outside diameter of which is identical with that of the first to fourth segment portions (14 to 17), has receptacles 6 arranged directly adjacent to one another for all four wafer stacks, which are already nested one inside the other. The annular grooves 7 which are made for this purpose in the circumferential direction are here aligned in such a way that one of these annular grooves is in alignment with each of the receptacles of portions 14–17. In the sixth portion, on the other hand, there are neither receptacles nor annular portions. Here, the roller has a planar surface 35 extending parallel to the longitudinal axis and designed as a flat.

Figure 7:
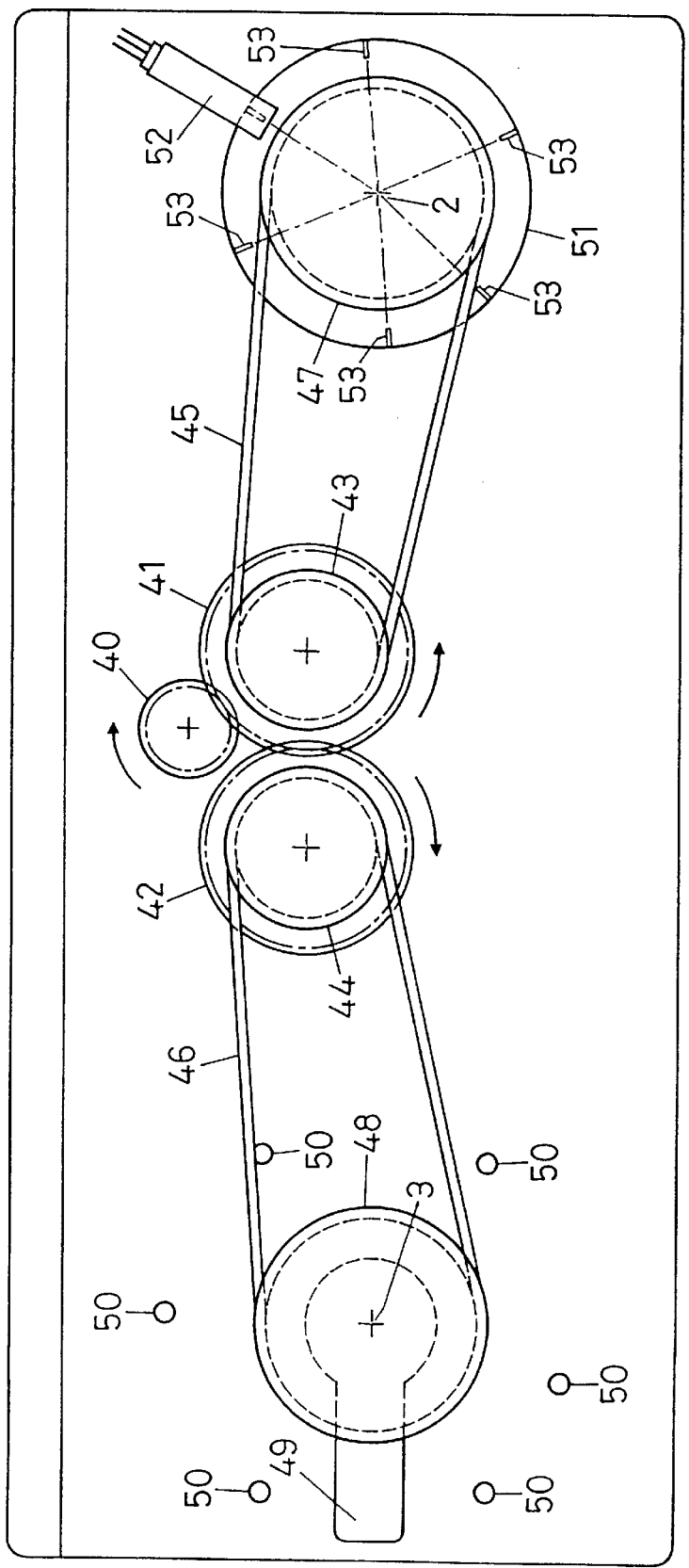
FIG. 7 shows a plan view of drive means for the rollers.

FIG. 7 shows a mechanism forming part of the drive means of the two rollers 2, 3. In this arrangement, an electric motor (not shown) drives a pinion 40, which engages in a gearwheel 41. The gearwheel 41 in turn meshes with another gearwheel 42. As the gearwheels rotate, respective tooled belt pulleys 43, 44 are taken along via respective shafts (not shown) of the two gearwheels 41, 42. Seated on the circumference of each of the two toothed belt pulleys 43, 44 is a toothed belt 45, 46, each of which is wrapped around another output-side toothed belt pulley 47, 48. The drive means thus have an enveloping drive for each roller 2, 3. In this arrangement, the two output-side toothed belt pulleys 47, 48 are each arranged on a shaft of one of the two rollers 2, 3. The single electric motor thus drives both rollers 2, 3 simultaneously, in particular in opposite directions of rotation.

Arranged in a rotationally fixed position on the toothed belt pulley 48 is a metallic rotating lug 49 which, during a full revolution of the toothed belt pulley 48, is moved past a plurality—namely six—induction sensors 50 distributed in a predetermined, nonuniform manner around the circumference of the toothed belt pulley.

Connected in a rotationally fixed position to the other output-side toothed belt pulley 47 is a slotted disc 51 which rotates between a sensor and detector element of an opto-switch sensor 52. Radially extending slots 53, which are detected by the opto-switch sensor, are made in the disc. In this arrangement, each of the slots corresponds to one holding position of the two rollers. The arrangement of the induction sensors 50 and of the slots 53 is here matched to one another in such a way that the rotating lug 49 is in front of one of the induction sensors 50 just before a slot 53 passes through the opto-switch sensor 52. This allows a control system (not shown) of the apparatus according to the invention to switch the motor of the rollers 2, 3 over from "fast speed" to "slow speed" and enables the positioning of the rollers (in the direction of rotation) to be performed on the basis of a signal from the opto-switch sensor 52. The induction sensors are thus used for rough positioning, while the opto-switch sensor is used for fine positioning of the rollers.

In order to nest one into another respective wafer stacks contained in two holding devices, e.g. magazines, in four successive process steps and thereby produce a new, compacted wafer stack, it must first be ensured that the rollers 2, 3 are ready to accept these wafers 4. To the extent that they do not already have this orientation, the rollers should, for this purpose, be swivelled in such a way that the annular portions 22 for the first wafers are approximately opposite one another. In FIG. 6, this is shown, by way of example, for the third segment portion 16, instead of for the annular portions 22.

In this holding position, the bottom surfaces 30 between the mutually opposite first annular portions 22 are oriented essentially orthogonally to a/an (imaginary) plane surface 58 extending horizontally through the centres of the wafers.

The wafers of the two first initial stacks are now raised vertically—as seen in the direction of the longitudinal axes 8, 9—between the first annular portions 22, i.e. past the bottom surfaces in the recesses. This movement is stopped as soon as the centre of the wafers is above the longitudinal axes 8, 9 and the wafers can be moved in the direction of the longitudinal axes without touching the rollers. The wafers are then moved in the direction of the longitudinal axis 8, 9 until they are above the receptacles 6 for the two first wafer stacks. The wafers are then lowered to place them in the receptacles provided for them on the rollers. The next initial stack of the two first wafer stacks is then arranged behind the last wafer of the preceding stack on the rollers 2, 3 in the same way. Here, even the two adjoining wafers of the two first initial stacks have the same spacing as all the other wafers from the next wafer to them.

The same result can also be achieved if it is the sixth (neutral) portions 19 which are initially opposite one another, instead of the two first portions 14. This allows the vertically aligned wafers to be raised vertically—in relation to the longitudinal direction 8, 9 of the rollers 2, 3—between the rollers into the correct Z position (cf. coordinate system in FIG. 1) to the level of the first annular portions 22. The wafers are positioned on the rollers by subsequently swivelling the rollers 2, 3 into the first holding position and lowering the wafers onto the rollers. This eliminates the need for the additional movement of the wafers parallel to the longitudinal axes (Z direction) as described above.

The holding arrangement is now moved over the holding rack 5 in the X direction and positioned there. The wafers are transferred from the rollers 2, 3 to the holding rack 5 by lowering the holding arrangement vertically (in the Y direction) and are there arranged in the corresponding receptacles provided for them in the holding rack. There is no change in the alignment or orientation of the wafers during this process. Once the rollers have been lowered to such an extent that rotation of the rollers is possible, they are swivelled so that the two surfaces of the sixth (neutral) portion 19 are aligned parallel to one another. This allows the two rollers to be raised vertically again past the wafers and moved along the X axis into a receiving position in which they are ready to receive the next two wafer stacks.

For this purpose, the rollers 2, 3 are rotated in such a way about their longitudinal axes 8, 9, by rotation of the motor (in the same direction of rotation as before), that the two second portions 15 are opposite one another. Here too, the bottom surfaces 31 arranged between the second portions of a roller are once again aligned vertically and orthogonally to a horizontal plane 58 extending through the centres of the wafers. The two wafer stacks are then arranged in the same way as that described above in the respective receptacles 6 provided for them on the rollers. Once the rollers 2, 3 are positioned at the same point above the holding rack 5 as before, they are lowered vertically. Since the wafers of the two second stacks are arranged offset on the rollers relative to the wafers of the two first stacks—in relation to the longitudinal axes 8, 9—each wafer of the second stack can be positioned in the holding rack between two wafers of the two first stacks. Once the rollers have been lowered to such an extent that they can be rotated freely, they are rotated back into the neutral holding position (the two sixth portions 19 are opposite one another) and then raised.

The wafers of both the third and the fourth stack can then be arranged one after the other in their corresponding receptacles on the rollers and inserted into the holding rack. For this purpose, the rollers must, of course, be arranged in the corresponding holding position at the receiving position by rotation about their longitudinal axes, in which holding position they can receive the corresponding wafer stacks. As already mentioned, this is shown in FIG. 6 for the reception of the wafers of the two third stacks. In this position, the receptacles 17 of the rollers for the wafers of the third stacks are approximately opposite one another. As before, this position too is determined by a vertical alignment of the bottom surfaces 32 present between each of the annular portions 24.

Finally, it should be mentioned that, in the holding rack, the wafers of the third stacks are each arranged between a wafer of the second stacks and a succeeding wafer of the two first stacks. The wafers of the fourth stacks, on the other hand, are each inserted between a wafer of the third stacks and a succeeding wafer of the first stacks.

Once all the wafers of the eight stacks in total are in the holding rack, a new wafer stack with a compaction of 1:4 has been formed. This means that the spacing between successive wafers in this new stack is just a quarter of the spacing between two wafers in one of the initial stacks.

There is no need to explain that the same sequences are also suitable, in principle, for a compaction ratio other than 1:4. In practice, an upper limit to the compaction ratio that can be achieved is given by the thickness of the wafers, the basic spacing in the wafer holding arrangements (magazines) and the different portions that can be made on the circumference of a roller. However, the compaction ratio can readily be increased by increasing the number of portions 14–19 on the rollers. The simplest way of increasing the number of portions that can be formed is to increase the diameter of the rollers.

The transfer method described above makes it possible to achieve compaction with the aid of the rollers without the need for the rollers to have a further translatory axis. Finally, it would, however, also be possible additionally to make the rollers moveable in a Z direction of a Cartesian coordinate system. This too can contribute to an increase in the compaction ratio that can be achieved.

Figure 8:
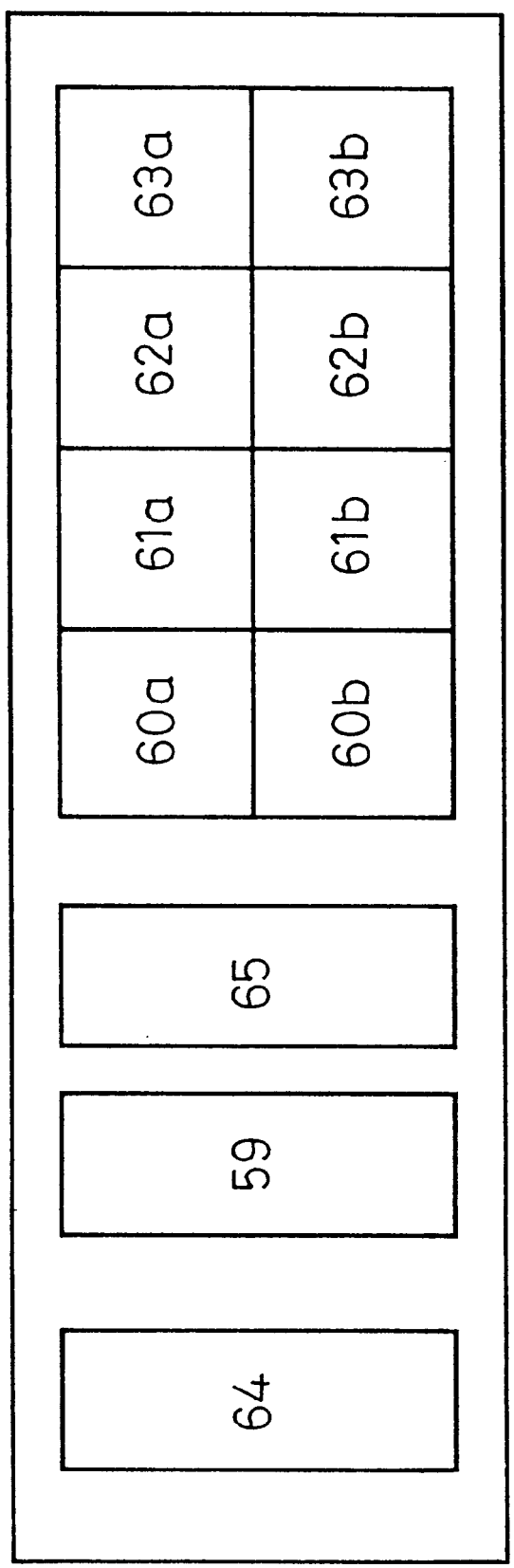
FIG. 8 shows a schematic plan view of a transfer apparatus according to the invention.

FIG. 8 shows a transfer location in highly schematized form. Here, the rectangles 60*a* and 60*b* symbolize the two first magazines, the wafers of which have been arranged together on the rollers and placed in the holding rack 5 of the loading station 59. The rectangles 61*a,* 61*b;* 62*a,* 62*b;* 63*a,* 63*b* correspond to the other six initial wafer stacks, which are each arranged in pairs. Finally, 64 represents a process location, e.g. a wet-process location, into which the wafers of the new stack can be introduced by means of the rollers 2, 3. For this purpose, they are gripped by the portions 18 of the rollers. Finally, the reference numeral 65 indicates an unloading station, which is provided with another holding rack and in which the wafers can be inserted with the aid of the rollers after they have been removed from the process location 64.

To put the wafers back in their original magazines, the process described above is performed essentially in reverse. This means that the rollers first of all raise each fourth wafer from the unloading station by means of their portions 17. Once the rollers are in the receiving position, a gripping device successively fetches the two halves of the wafer stack situated on the rollers and inserts each of the wafers back into one of the magazines. Once this operation has been carried out on all the wafers in the unloading station, all the wafers are in the same positions in their magazines as at the beginning of the transfer process.

What is claimed is:

1. A wafer transfer apparatus for transferring and compacting wafers stacked in an interspaced manner in a first holding device into a second holding device, comprising:

a carrier device having two rollers arranged parallel to one another and rotatable about a respective longitudinal axis; and drive means for arranging the rollers in a plurality of rotational positions, wherein the rollers have a circumference and are divided into a plurality of segment portions, each of the plurality of segment portions having at least one receptacle being offset in a longitudinal and circumferential direction relative to at least one receptacle of another of the plurality of segment portions, the receptacles of at least three of the plurality of segment portions begin arranged to arrange the wafers of at least three wafer stacks, the rollers further including a fourth segment having receptacles for simultaneous arrangement of wafers of the at least three wafer stacks and being essentially in alignment in the circumferential direction of the roller with the receptacles of the at least three segment portions.

2. The wafer transfer apparatus according to claim 1, wherein the fourth segment portion includes a first spacing between the receptacles of the fourth segment which follow one another in the longitudinal direction of the respective roller, and the at least three segments include a second spacing between the receptacles of the at least three segment portions which follow one another in the longitudinal direction of the respective roller, the first spacing being smaller than the second spacing.

3. The wafer transfer apparatus according to claim 1, wherein the at least three segment portions form an arrangement repeated alternately in the longitudinal direction of the roller, wherein the roller includes a surface between each arrangement at a smaller spacing from the longitudinal axis of the respective roller than a spacing of the receptacles of the at least three segment portions from the longitudinal axis of the respective roller.

4. The wafer transfer apparatus according to claim 1, wherein each of the rollers is provided on the circumference with a further segment portion having receptacles for the simultaneous handling of all of the wafers of a compacted wafer stack.

5. The wafer transfer apparatus according to claim 1, wherein each of the rollers can be arranged in at least five rotational positions.

6. The wafer transfer apparatus according to claim 1, wherein each of the rollers can be arranged in six rotational positions.

7. The wafer transfer apparatus according to claim 1, wherein each of the rollers are rotated through various angles to define predetermined holding positions, said various angles being of differing magnitudes.

8. The wafer transfer apparatus according to claim 1, wherein the drive means includes a common drive for driving each of the two rollers.

9. The wafer transfer apparatus according to claim 1, wherein the two rollers are adapted to be driven in opposite directions of rotation, the two rollers being mirror-symmetrical to one another.

10. A method of transferring and compacting a plurality of stacks of wafers in a holding station, the plurality of stacks of wafers being arranged spaced apart in respective holding devices, the wafers of each stack being arranged in receptacles offset in a longitudinal and a circumferential direction, the wafers being on the circumference of two rollers of a carrier device which are arranged parallel to one another, in which the two rollers can be rotated about their longitudinal axes and can be arranged in a plurality of holding positions of rotary motion, the method comprising:

arranging the two rollers in a first holding position;

inserting wafers of at least a first stack into first receptacles;

depositing the wafers of the at least one first stack into the holding station;

arranging the two rollers into a second holding position;

inserting wafers of at least one second stack into second receptacles;

depositing the wafers of the at least one second stack into the holding devices, each wafer of the at least one second stack being inserted between two wafers of the first stack;

arranging the two rollers into a third holding position;

inserting wafers of at least one third stack into third receptacles; and depositing the wafers of the at least one third stack into the holding device, each wafer of the at least one third stack being inserted between two wafers of the first and second stacks.

11. The method according to claim 10, wherein a spacing between the longitudinal axes of the two rollers remains unchanged during the method.

12. The method according to claim 10, further comprising inserting wafers of at least one fourth stack into fourth receptacles; and depositing the wafers of the at least one fourth stack into the holding device, each wafer of the at least one fourth stack being inserted between respective second wafers of the wafer stacks previously transferred.

13. The method according to claim 10, wherein, during the insertion steps, each of the rollers is arranged in a rotational holding position assigned to the respective stack and, for simultaneous arrangement of all of the wafer stacks on the rollers, each of the rollers is arranged in at least one further holding position.

14. The method according to claim 10, further comprising processing a compacted wafer stack by arranging the two rollers a rotational holding position in which all of the wafers of the compacted stack are grasped and transported.

* * * * *

UNITED STATES PATENT AND TRADEMARK OFFICE
CERTIFICATE OF CORRECTION

PATENT NO.    : 6,431,811 B1                                              Page 1 of 1
DATED         : August 13, 2002
INVENTOR(S)   : Jakob Blattner et al.

It is certified that error appears in the above-identified patent and that said Letters Patent is hereby corrected as shown below:

<u>Title page,</u>
Item [56], References Cited, delete "WO98/13497" and insert -- WO99/13497 --.

Signed and Sealed this

Fourteenth Day of January, 2003

JAMES E. ROGAN
*Director of the United States Patent and Trademark Office*